(12) United States Patent
Xie et al.

(10) Patent No.: US 8,354,320 B1
(45) Date of Patent: Jan. 15, 2013

(54) METHODS OF CONTROLLING FIN HEIGHT OF FINFET DEVICES BY PERFORMING A DIRECTIONAL DEPOSITION PROCESS

(75) Inventors: Ruilong Xie, Albany, NY (US); Robert Miller, Yorktown Heights, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/369,482

(22) Filed: Feb. 9, 2012

(51) Int. Cl.
*H01L 21/00* (2006.01)

(52) U.S. Cl. ........................ 438/279; 438/300

(58) Field of Classification Search .......... 438/275–279, 438/300
See application file for complete search history.

(56) References Cited

U.S. PATENT DOCUMENTS

| | | | |
|---|---|---|---|
| 6,642,090 B1 * | 11/2003 | Fried et al. | 438/164 |
| 6,720,619 B1 * | 4/2004 | Chen et al. | 257/347 |
| 7,071,122 B2 | 7/2006 | Saenger et al. | |
| 7,323,389 B2 | 1/2008 | Goktepeli et al. | |
| 7,919,335 B2 | 4/2011 | Xiao et al. | |
| 8,048,723 B2 | 11/2011 | Chang et al. | |
| 2007/0026615 A1 | 2/2007 | Goktepeli et al. | |
| 2009/0057574 A1 | 3/2009 | Wagner et al. | |
| 2009/0057731 A1 | 3/2009 | Kitajima | |
| 2009/0087579 A1 | 4/2009 | Hautala | |
| 2010/0021985 A1 | 1/2010 | Mason | |
| 2010/0025766 A1 | 2/2010 | Nuttinck et al. | |
| 2011/0031552 A1 | 2/2011 | Iwamatsu et al. | |
| 2011/0049629 A1 | 3/2011 | Ishikawa et al. | |
| 2011/0084214 A1 | 4/2011 | Hautala et al. | |
| 2011/0084215 A1 | 4/2011 | Hautala et al. | |
| 2011/0084216 A1 | 4/2011 | Hautala et al. | |
| 2011/0260282 A1 | 10/2011 | Kawasaki | |

\* cited by examiner

*Primary Examiner* — Richard A. Booth
(74) *Attorney, Agent, or Firm* — Williams, Morgan & Amerson, P.C.

(57) ABSTRACT

One illustrative method disclosed herein includes a forming plurality of trenches in a substrate to thereby define a fin structure for a FinFET device, forming a first region of a first insulating material within each of the trenches, wherein the as-deposited surface of the first insulating material is positioned below an upper surface of the fin, forming a layer of a second material that contacts the as-deposited surface of the first region of the first insulating material and overfills the trenches, performing at least one process operation to remove at least a portion of the layer of the second material from above the fin structure, and, after performing the at least one process operation, performing a second process operation to selectively remove the second material from above the first region of the first insulating material and thereby expose the as-deposited surface of the first region of the first insulating material.

34 Claims, 8 Drawing Sheets

METHODS OF CONTROLLING FIN HEIGHT OF FINFET DEVICES BY PERFORMING A DIRECTIONAL DEPOSITION PROCESS

BACKGROUND OF THE INVENTION

1. Field of the Invention

Generally, the present disclosure relates to the manufacturing of sophisticated semiconductor devices, and, more specifically, to various methods of controlling the height of fins in FinFET semiconductor devices by performing a directional deposition process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

One traditional technique for establishing the height of the fins of a FinFET device typically involves the following steps: 1) performing an etching process through a patterned mask layer to define a plurality of trenches in a semiconducting substrate which thereby defines a plurality of fin structures; 2) over-filling the trenches with an insulating material, such as silicon dioxide; 3) performing a chemical mechanical polishing (CMP) process using the hard mask layer as a polish-stop to remove excess amounts of the insulating material; and 4) performing an etching process to remove a desired amount of the insulating material from within the trenches until such time as only the desired amount of the insulating material remains positioned in the bottom of the trenches (hereinafter referred to as the "CMP/etch-back" process). The height of the fins is set by the amount of the fin structure that is positioned above the remaining amount of insulating material that is positioned in the bottom of the trenches.

Ideally, the height of all of the fins in a typical FinFET device would be uniform as such a configuration would make device operation more consistent and predictable. Unfortunately, the CMP/etch-back process may not produce fins having a substantially uniform height for a variety of reasons. More specifically, process variations in the CMP process and/or the etch-back process may produce fins that have unacceptable variations in fin height. For example, the CMP process may not produce a truly planar surface on the layer of insulating material, i.e., there may be relatively large topography differences across the surface of the polished layer of insulating material. Thus, even if the etch-back process is performed uniformly across the polished insulating material, the undesirable topography differences may simply be transferred to the remaining portions of the insulating material that are positioned in the bottom of the trenches after the etch-back process is completed. Additionally, the etch-back process may not be uniform across the polished layer of insulating material. As a result, there may be differences in thickness of the insulating material that is positioned in the bottom of the trenches.

To the extent that a given process produces fins of differing height, one solution is to base the design of the overall FinFET device on the "worst-case" fin height. As a result, the performance of FinFET devices made by employing the previously described CMP/etch-back process to establish the height of the fins in such a FinFET device may be less than desired or less than may be achieved if the fins in such a device had a substantially uniform fin height.

The present disclosure is directed to various methods of controlling the height of fins in FinFET devices by performing a directional deposition process.

SUMMARY OF THE INVENTION

The following presents a simplified summary of the invention in order to provide a basic understanding of some aspects of the invention. This summary is not an exhaustive overview of the invention. It is not intended to identify key or critical elements of the inven-tion or to delineate the scope of the invention. Its sole purpose is to present some concepts in a simplified form as a prelude to the more detailed description that is discussed later.

Generally, the present disclosure is directed to various methods of controlling the height of fins in FinFET devices by performing a directional deposition process. One illustrative method disclosed herein includes forming a plurality of trenches in a substrate to thereby define a fin structure for a FinFET device, forming a first region of a first insulating material within each of the trenches, wherein the as-deposited surface of the first insulating material is positioned below an upper surface of the fin, forming a layer of a second material (such as an insulating material, a photoresist material, an organic development material, etc.) that contacts the as-deposited surface of the first region of the first insulating material and overfills the trenches, performing at least one first process operation to remove at least a portion of the layer of the second material from above the fin structure, and, after performing the at least one first process operation, performing at least one second process operation to selectively remove the second material from above the first region of the first insulating material and thereby expose the as-deposited surface of the first region of the first insulating material.

Another illustrative method disclosed herein includes forming a plurality of trenches in a semiconducting substrate to thereby define a fin structure for a FinFET device, performing a gas cluster ion beam process to form a first region of a first insulating material within each of the trenches and to form a second region of the first insulating material above an upper surface of the fin structure, forming a layer of a second material (such as an insulating material, a photoresist material, an organic development material, etc.) that overfills the trenches and covers an upper surface of the second region of the first insulating material, and removing at least a portion of the layer of the second material to thereby expose the upper surface of the second region of the first insulating material. In this example, the method also includes performing at least one etching process to remove at least the second region of the first insulating material from above the upper surface of the fin structure, and performing at least one process operation to selectively remove the second material from above the first region of the first insulating material and thereby expose an as-deposited surface of the first region of the first insulating material.

Yet another illustrative method disclosed herein involves forming a plurality of trenches in a semiconducting substrate to thereby define a fin structure for a FinFET device, forming a first region of a first insulating material within each of the trenches, wherein the first region of the first insulating material has an as-deposited surface that is positioned below an upper surface of the fin, and forming a first region of a second insulating material within each of the trenches that contacts the as-deposited surface of the first region of the first insulating material, wherein the first region of the second insulating material has an as-deposited surface that is positioned below the upper surface of the fin. In this example, the method further includes forming another layer of material that contacts the as-deposited surface of the first region of the second insulating material and overfills the trenches, wherein at least a portion of the another layer of material is positioned above an upper surface of the fin structure, performing at least one first process operation to remove at least a portion of the another layer of material from above the upper surface of the fin structure, and, after performing the at least one first process operation, performing at least one second process operation to selectively remove the another layer of material from above the first region of the second insulating material and thereby expose the as-deposited surface of the first region of the second insulating material.

BRIEF DESCRIPTION OF THE DRAWINGS

The disclosure may be understood by reference to the following description taken in conjunction with the accompanying drawings, in which like reference numerals identify like elements, and in which.

Figure 1A:
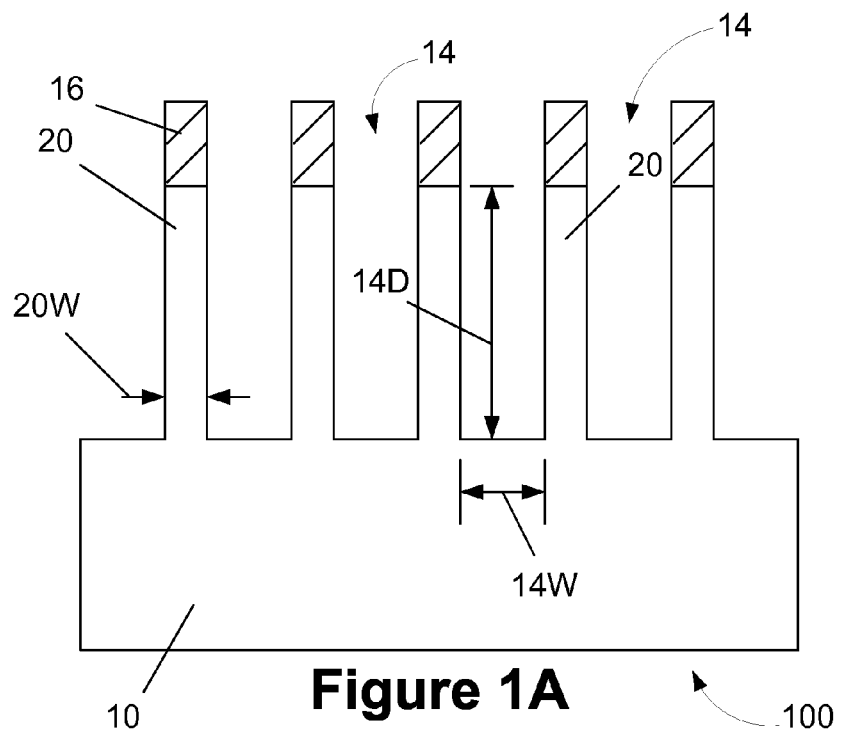
FIGS. 1A-1H depict one illustrative method disclosed herein for controlling the height of fins on an illustrative FinFET device by performing at least one directional deposition process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of controlling the height of fins in FinFET devices by performing a directional deposition process. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process and thereafter patterned using known sidewall image transfer techniques and/or photolithographic techniques combined with performing known etching techniques.

With continuing reference to FIG. 1A, an etching process, such as a dry or wet etching process, is performed on the substrate 10 through the patterned mask layer 16 to form a plurality of trenches 14. This etching process results in the definition of a plurality of fins 20. The overall size, shape and configuration of the trenches 14 and fins 20 may vary depending on the particular application. The depth 14D and width 14W of the trenches 14 may vary depending upon the particular application. In one illustrative embodiment, based on current day technology, the depth 14D of the trenches 14 may range from approximately 30-200 nm and the width 14W of the trenches 14 may range from about 20-50 nm. In some embodiments, the fins 20 may have a width 20W within the range of about 5-30 nm. In the illustrative example depicted in FIGS. 1A-1H, the trenches 14 and fins 20 are all of a uniform size and shape. However, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
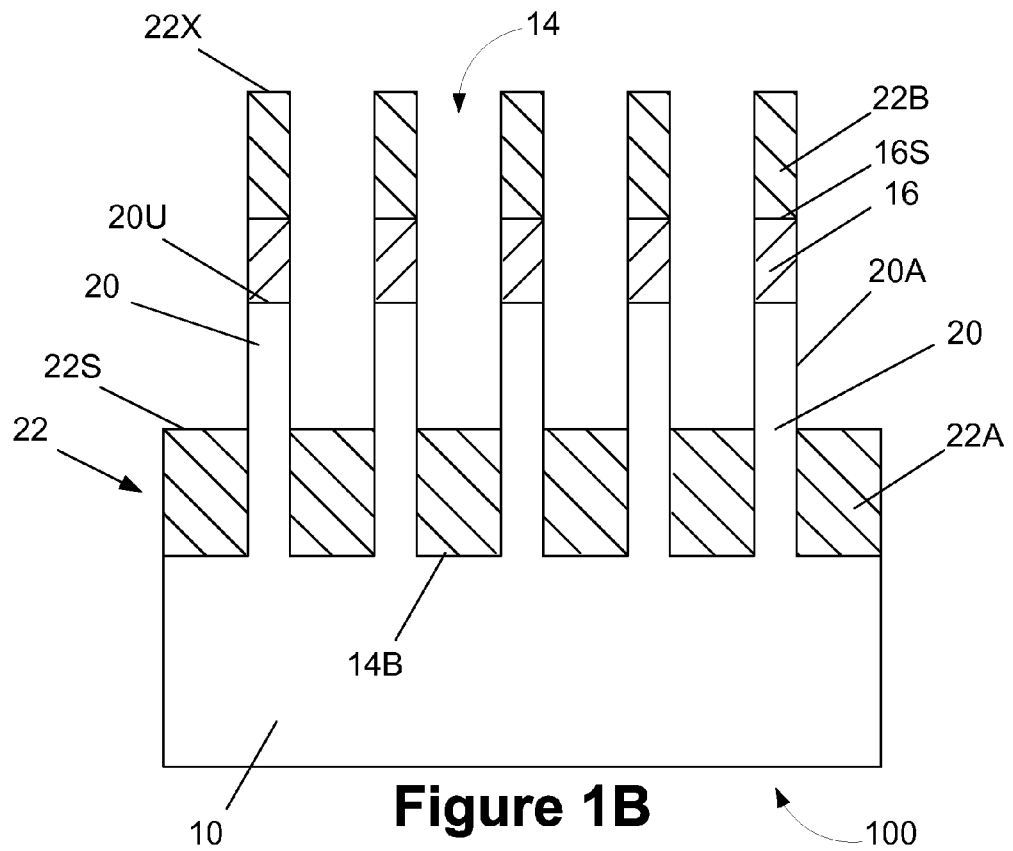

Then, as shown in FIG. 1B, regions of a first insulating material 22 are formed on the device 100. In the depicted example, the first insulating material 22 is comprised of a plurality of first regions 22A formed in the trenches 14 and a plurality of second regions 22B formed above the patterned hard mask layer 16. The plurality of first regions 22A are physically separated from one another, i.e., they are not connected together, as is the case with the plurality of second regions 22B. Additionally, the regions 22A, 22B are not connected to one another. The first regions 22A of the first insulating material 22 have an as-deposited surface 22S that is positioned below the upper surface 20U of the fins 20. The second regions 22B of the first insulating material 22 have an as-deposited surface 22X. The regions 22A, 22B of the first insulating material 22 are formed by performing a directional deposition process such as, for example, a gas cluster ion beam (GCIB) process. The GCIB process is a deposition process that is highly directional in nature, as described in US published patent application 2009/0087579, which is hereby incorporated by reference in its entirety. That is, the directional deposition process results in the deposition of the insulating material 22 on the horizontally oriented surfaces of the device 100, such as the bottom 14B of the trenches 14 and the upper surface 16S of the patterned hard mask layer 16, while avoiding deposition of any substantial amount of the insulating material 22 on the vertically-oriented surfaces of the device 100, such as the sidewalls 20A of the fins 20. In general, as described more fully below, the first insulating material 22 should be made of a material that may be selectively etched relative to the substrate 10 and another insulating material that will be formed above the regions of the first insulating material 22. Thus, the first insulating material 22 may be comprised of a variety of different materials, such as silicon nitride, silicon dioxide, etc. The thickness of the first insulating material regions 22A may be selected so as to control the final desired height of the fins 20. In one illustrative embodiment where the trench depth 14D is about 100 nm, the first insulating material regions 22A may be a layer of silicon nitride that has a thickness of about 70 nm. In this illustrative example, as described more fully below, the final height of the fins 20 will be about 30 nm. Of course, this is but just one example, as the methods disclosed herein provide great flexibility in setting the final height of the fins 20 to any desired height and in a manner that produces uniform fin height in a reliable and repeatable manner.

Figure 1C:
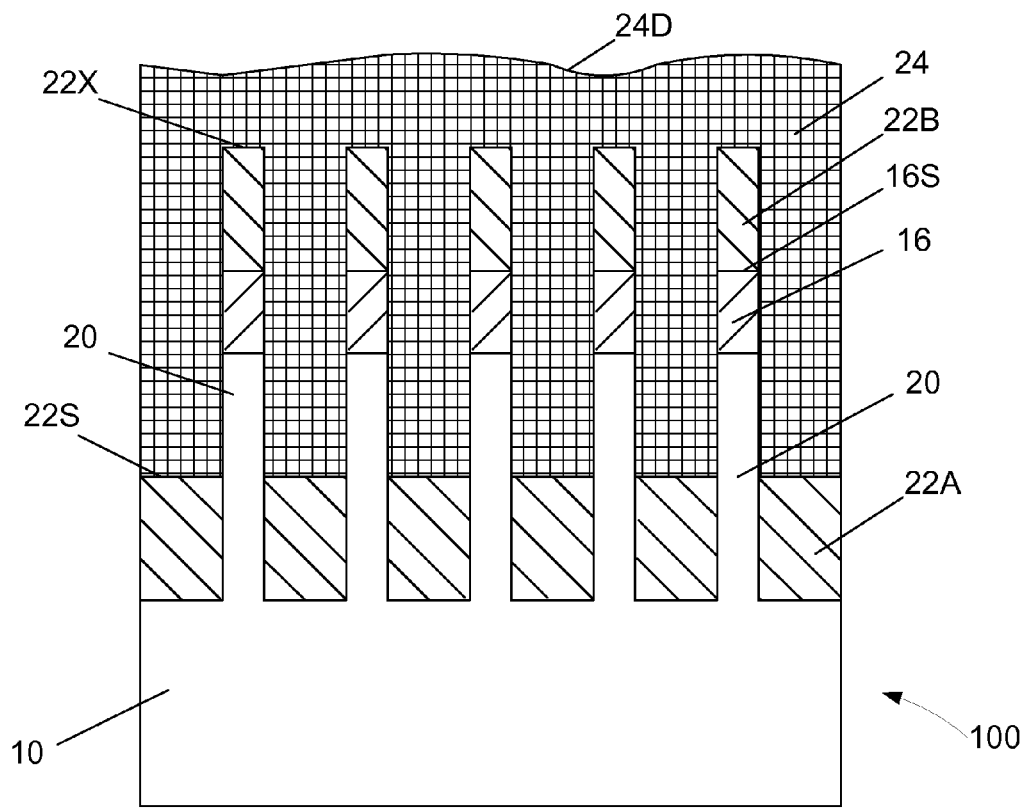

In FIG. 1C, a layer of a second material 24 has been blanket-deposited such that it overfills the trenches 14. In the depicted example, the layer of the second material 24 contacts the as-deposited surfaces 22S, 22X of the first and second regions 22A, 22B, respectively, of the first insulating material 22. The layer of the second material 24 has a non-uniform, as-deposited surface 24D. The layer of the second material 24 may be made of a variety of materials, the selection of which depends upon the material selected for the first insulating material 22. For example, the second material 24 may be an insulating material, such as silicon dioxide, a layer of photoresist, an organic development layer, etc. In general, in the depicted example, the layer of the second material 24 should be made of a material that may be selectively etched or removed (e.g., by ashing) relative to the substrate 10 and the first insulating material 22. In one illustrative example where the first insulating material 22 is made of silicon nitride, the layer of the second material 24 may be made of silicon dioxide. The layer of the second material 24 may be formed by performing any of a variety of known processes, such as a CVD process, or spin-on coating, etc.

Figure 1D:
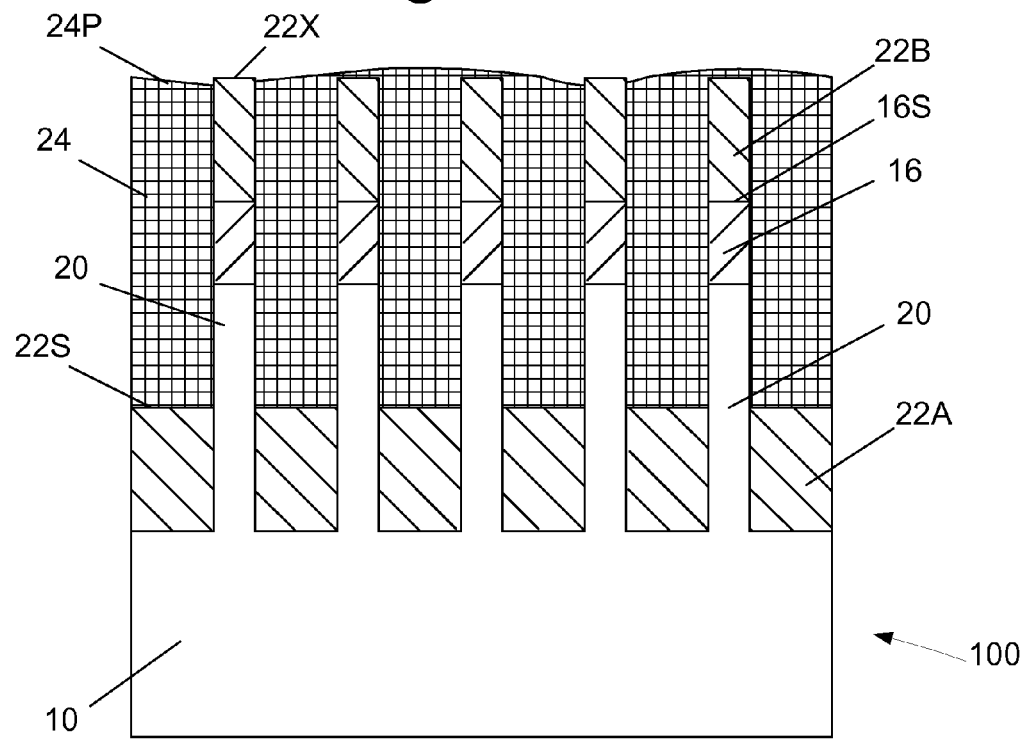
Figure 1E:
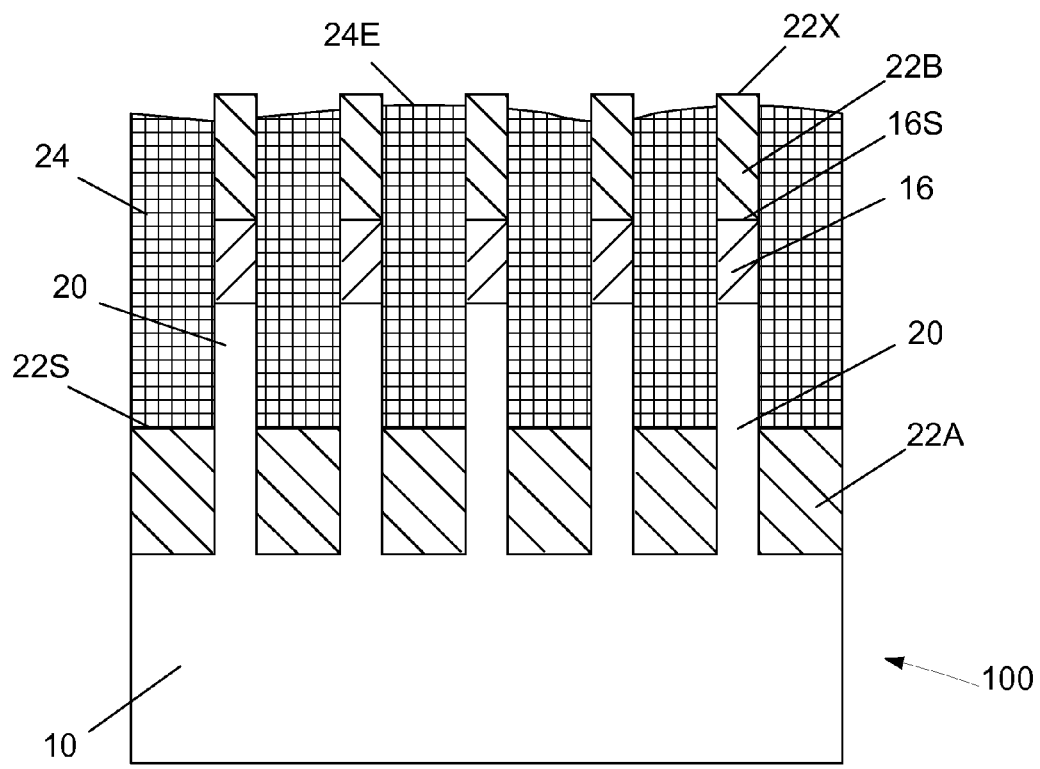

FIG. 1D depicts the device 100 after a chemical mechanical polishing (CMP) process has been performed on the layer of the second material 24 with the intent to expose the as-deposited, upper surface 22X of the second regions 22B of the first insulating material 22. As depicted, in one example, the layer of the second material 24 may be a layer of silicon dioxide that has a non-uniform, polished surface 24P that may not expose all of the upper surfaces 22X of the second regions 22B of the first insulating material 22. In some cases, the CMP process may be performed for sufficient duration to ensure that all of the upper surfaces 22X of the regions 22B are exposed. Alternatively, as shown in FIG. 1E, a relatively quick etching process may be performed on the layer of the second material 24 after the CMP process is performed to insure that the etched surface 24E of the layer of the second material 24 is at a level such that all of the upper surfaces 22X of the of the second regions 22B of the first insulating material 22 are exposed. As yet another alternative, after the layer of the second material 24 is initially formed, as depicted in FIG. 1C, the aforementioned CMP process may be skipped and an etching process may be performed on the layer of the second material 24 for such a duration that the etched surface 24E is at a level such that all of the upper surfaces 22X of the second regions 22B of the first insulating material 22 are exposed, as depicted in FIG. 1E. One further alternative to remove the second regions 22B would be to perform a CMP process that stops on the patterned hard mask layer 16.

Figure 1F:
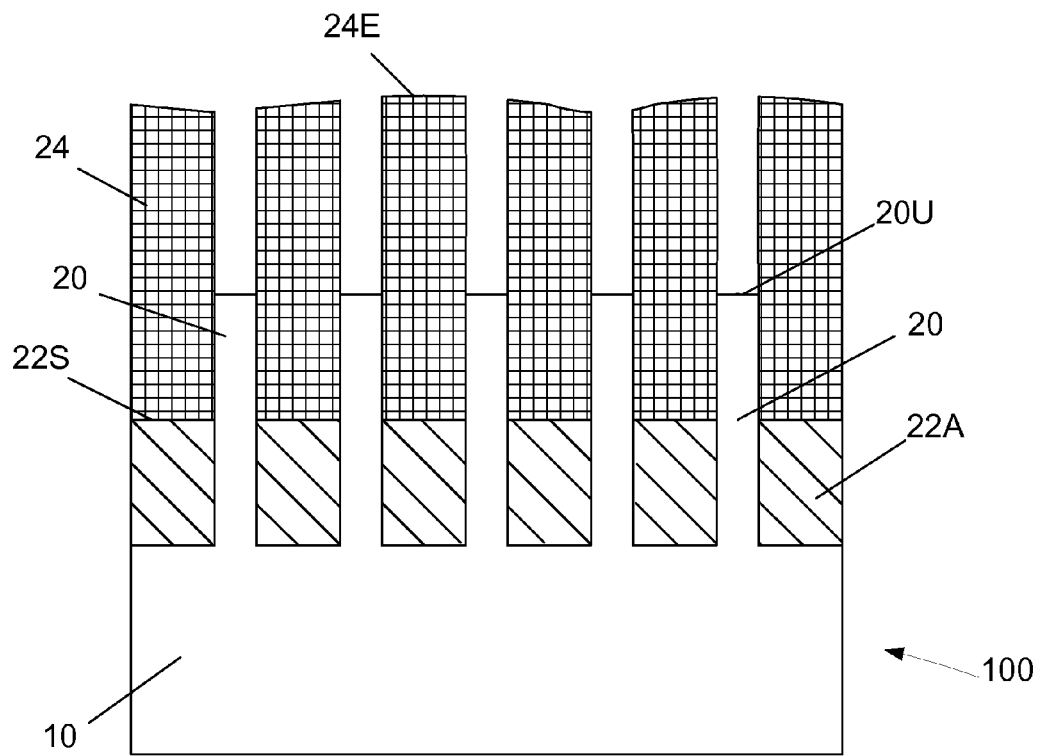

Next, as shown in FIG. 1F, one or more etching processes are performed to remove the second regions 22B of the first insulating material 22 positioned above the patterned hard mask layer 16, and to remove the patterned hard mask layer 16 from above the fins 20. This process exposes the upper surface 20U of the fins 20. In the case where the second material 24 is comprised of silicon dioxide and the first insulating material 22 and the patterned hard mask layer 16 are comprised of silicon nitride, the first insulating material 22 and the patterned hard mask layer 16 may be removed by performing an etching process using hot phosphoric acid. Although not depicted in the drawings, if there is concern about exposing the upper surface 20U of the fins 20 to the process that is used to remove the patterned hard mask layer 16, a protection layer, such as a layer of silicon dioxide, may be formed above the upper surface 20U of the fins 20 at some point during the process. For example, such a protection layer may be formed on the substrate 10 prior to forming the hard mask layer 16 and prior to performing an etching process(es) to define the trenches 14 in the substrate 10. To the extent such a protection layer is formed above the upper surface 20U of the fins 20, it may or may not be subsequently removed. To the extent that the aforementioned alternative process of performing a CMP process to remove the regions 22B is performed (described at the end of the previous paragraph), then the etching process described in this paragraph would only need to be performed to remove the patterned hard mask layer 16. Additionally, in the case where the second regions 22B and the patterned hard mask layer 16 are made of different material (e.g., silicon nitride for the second regions 22B and silicon dioxide for the hard mask layer 16) the second regions 22B may be removed and the removal of the hard mask layer 16 may be deferred to a later point in the process, e.g., it may be removed concurrently when the layer 24 is removed or even later.

Figure 1G:
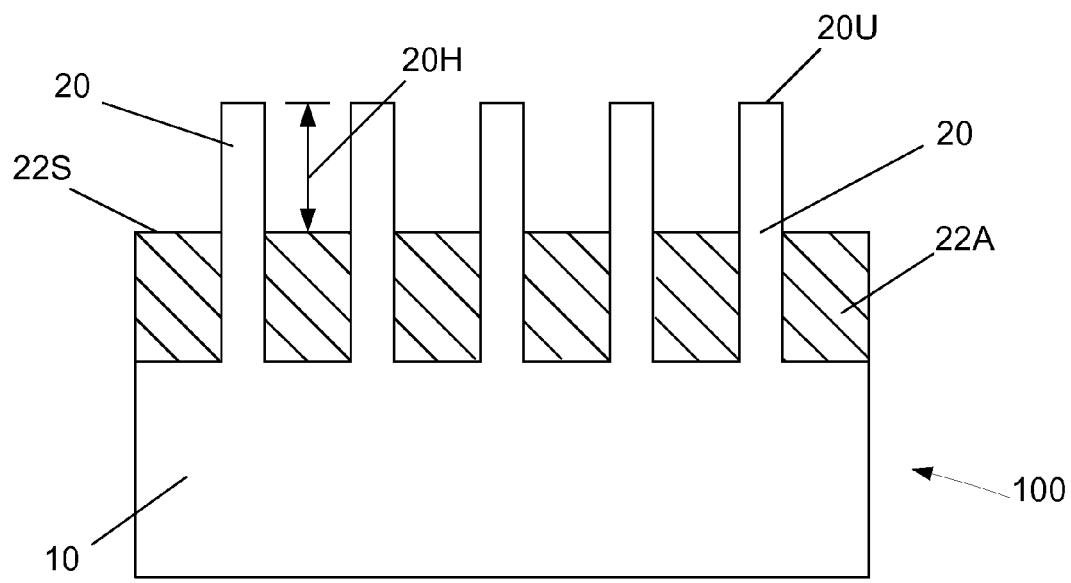

Then, as shown in FIG. 1G, in the illustrative example depicted in the drawings, an etching process or other removal process, e.g., ashing, is performed to remove the layer of the second material 24 selectively relative to the first regions 22A of the first insulating material 22 and the fins 20. This process exposes the as-deposited surfaces 22S of the first regions 22A of the first insulating material 22. In the case where the second material 24 is comprised of silicon dioxide and the first insulating material 22 is comprised of silicon nitride, the second material 24 may be removed by performing an etching process using HF acid. As depicted in FIG. 1G, the final fin height 20H is only based upon the initial depth 14D (FIG. 1A) of the trenches 14 and the thickness of the first regions 22A of the first insulating material 22 deposited in the bottom of the trenches 14. That is, unlike prior art processes that may produce undesirable variations, the final height 20H of the fins 20 is not based upon the accuracy or planarity of a CMP process, nor is it based upon accurately and repeatedly performing an etching process to reduce the thickness of a layer of material, e.g. silicon dioxide, that is formed in the trenches 14. At this point, traditional fabrication techniques may be performed to complete the fabrication of the illustrative FinFET device 100.

Figure 1H:
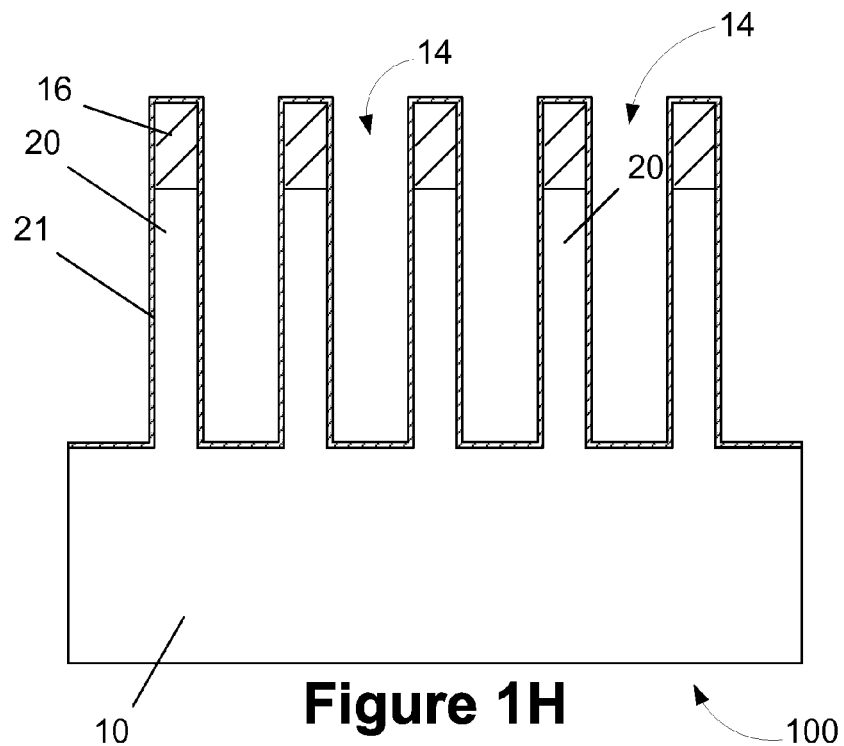

FIG. 1H depicts an alternative embodiment wherein a protection layer 21 is formed on the device 100 after the trenches 14 are initially formed. For example, in the case where the first insulating material 22 is comprised of silicon nitride, in lieu of having the silicon nitride material be in direct contact with the silicon fins 20, a thin layer 21 of, for example, silicon dioxide, may be conformably deposited on the device 100. In one illustrative embodiment, the layer 21 may have a thickness of about 2-5 nm and it may be formed by performing a conformal CVD deposition process. If this layer 21 is formed, processing may then continue as described above, with the understanding that at least the portions of the layer 21 that are positioned above the patterned mask layer 16 may need to be removed by performing a subsequent etching process or by extending the duration of a CMP process.

Figure 2A:
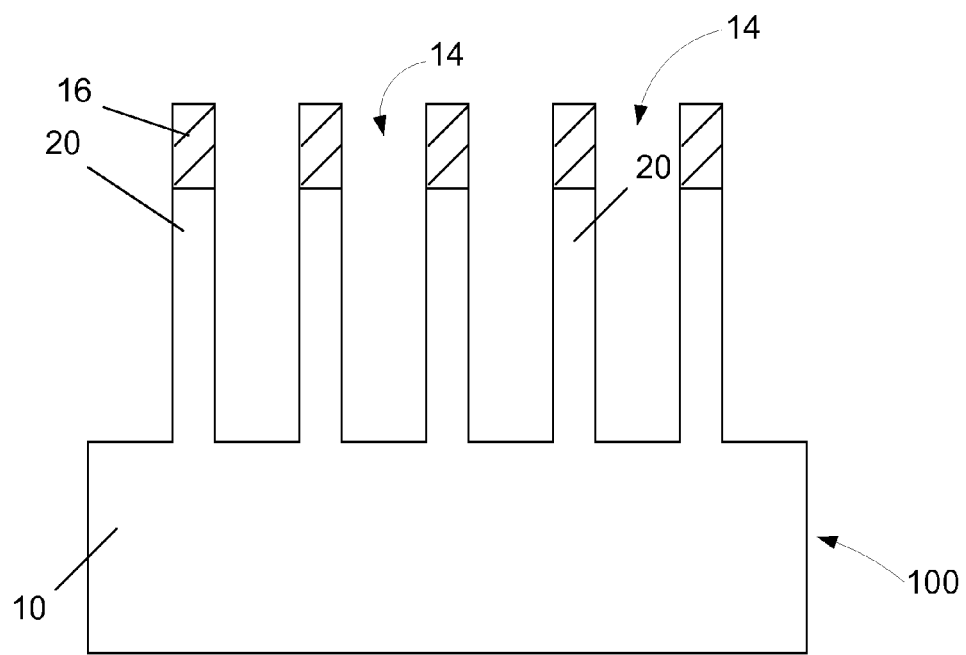
FIGS. 2A-2H depict another illustrative method disclosed herein for controlling the height of fins on an illustrative FinFET device by performing at least one directional deposition process.
Figure 2B:
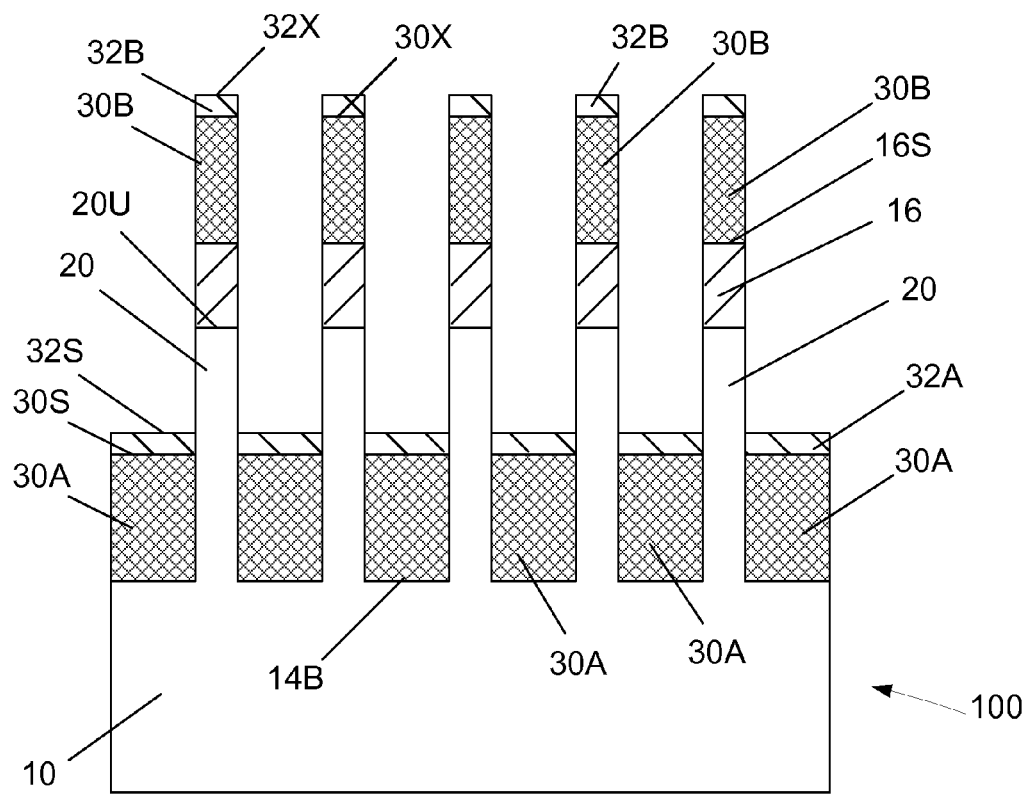

FIGS. 2A-2H depict another illustrative method of controlling the height of fins in FinFET devices by performing at least one directional deposition process. FIG. 2A depicts the device 100 at a point of fabrication that corresponds to the one depicted in FIG. 1A, i.e., an etching process has been performed through the patterned mask layer 16 to define the trenches 14 in the substrate 10 which thereby defines the fins 20. Then, as shown in FIG. 2B, a plurality of first regions 30A of a first insulating material 30 are formed in the trenches 14 of the device and a plurality of second regions 30B of the first insulating material 30 are formed above the patterned hard mask layer 16. The plurality of first regions 30A are physically separated from one another, i.e., they are not connected together, as is the case with the plurality of second regions 30B. Additionally, the regions 30A, 30B are not connected to one another. The first regions 30A of the first insulating material 30 have an as-deposited surface 30S that is below the upper surface 20U of the fins 20. The second regions 30B of the first insulating material 30 have an as-deposited surface 30X. The regions 30A, 30B of the insulating material 30 are formed by performing a first directional deposition process, such as, for example, a first gas cluster ion beam (GCIB) process. As mentioned above, the GCIB process is a deposition process that is highly directional in nature. That is, the directional deposition process results in the deposition of the first insulating material 30 on the horizontally oriented surfaces of the device 100, such as the bottom 14B of the trenches 14 and the upper surface 16S of the patterned hard mask layer 16, while avoiding deposition of any substantial amount of the first insulating material 30 on the vertically-oriented surfaces of the device 100.

With continuing reference to FIG. 2B, a second directional deposition process, such as, for example, a second gas cluster ion beam process is then performed to form a plurality of first regions 32A of a second insulating material 32 in the trenches 14 of the device and to form a plurality of second regions 32B of the second insulating material 32 above the patterned hard mask layer 16. The plurality of first regions 32A are physically separated from one another, i.e., they are not connected together, as is the case with the plurality of second regions 32B. Additionally, the regions 32A, 32B are not connected to one another.

The first regions 32A of the second insulating material 32 have an as-deposited surface 32S that is below the upper surface 20U of the fins 20. In one illustrative embodiment, the first regions 32A of the second insulating material 32 contact the as-deposited surface 30S of the first regions 30A of the first insulating material 30. The second regions 32B of the second insulating material 32 have an as-deposited surface 32X. The layers of insulating material 30 and 32 may be made of a variety of different materials, but they should be selected such that they are selectively etchable with respect to one another. In one illustrative embodiment, the insulating material 30 may be silicon dioxide, while the insulating material 32 may be silicon nitride. The thickness of the layers 30, 32 may vary depending upon the particular application. In one illustrative embodiment, the regions 30A, 30B of the first insulating material 30 may have a thickness of about 50 nm, while the regions 32A, 32B of the second insulating material 32 may have a thickness of about 20 nm.

Figure 2C:
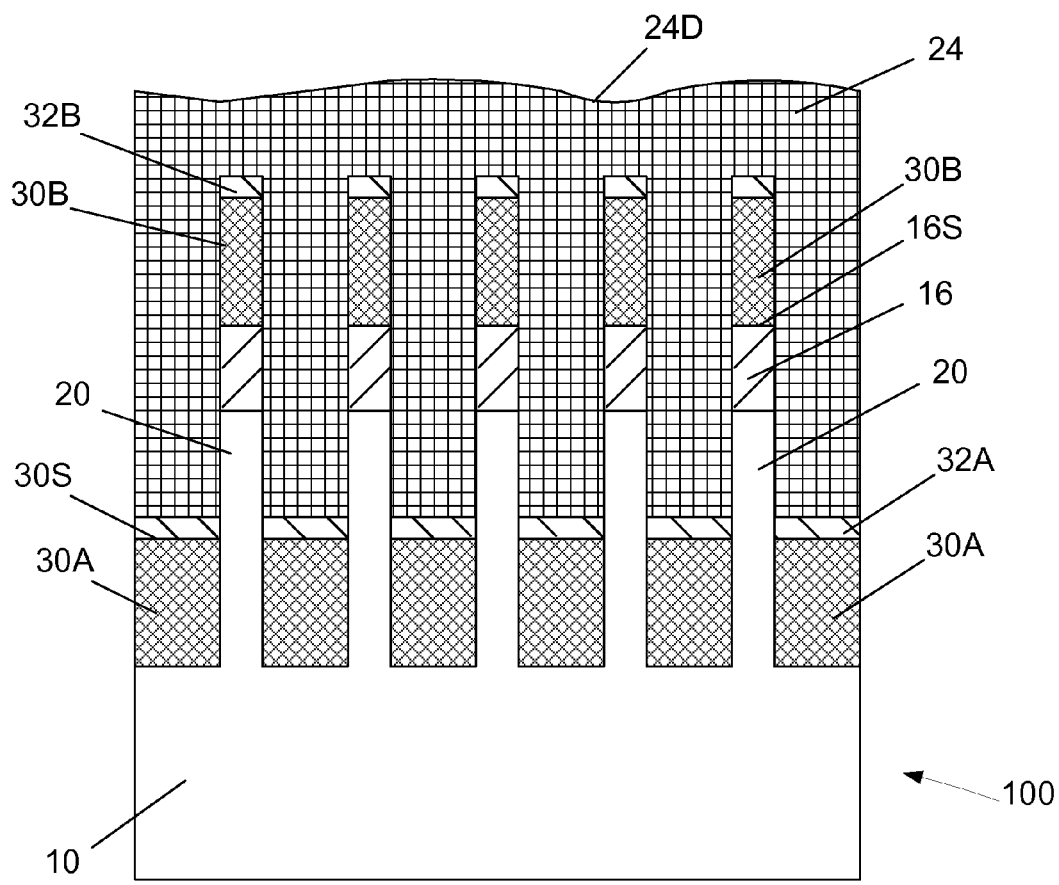

Next, as shown in FIG. 2C, another layer of material, such as the previously described layer of second material 24, is formed such that it overfills the trenches 14. In the depicted example, the layer of the second material 24 has a non-uniform, as-deposited surface 24D. The layer of the second material 24 may be made of a variety of materials, the selection of which depends upon the material selected for the second insulating material 32. In general, in the depicted example, the layer of the second material 24 should be made of a material that may be selectively etched relative to the substrate 10 and the second insulating material 32. In one illustrative example, where the second insulating material 32 is made of silicon nitride, the layer of the second material 24 may be made of silicon dioxide.

Figure 2D:
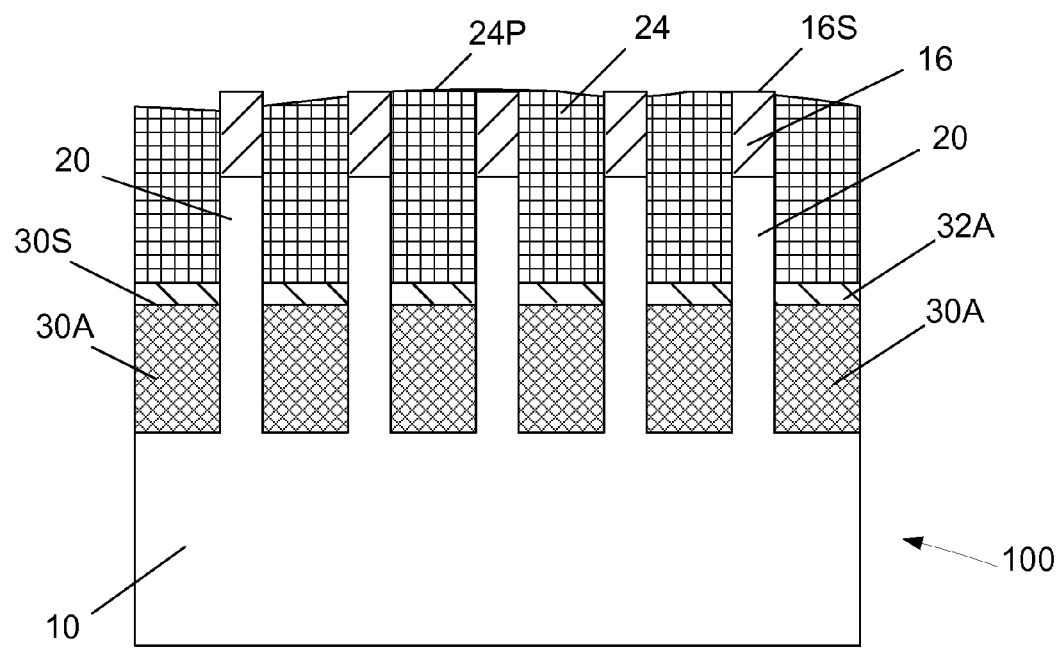
Figure 2E:
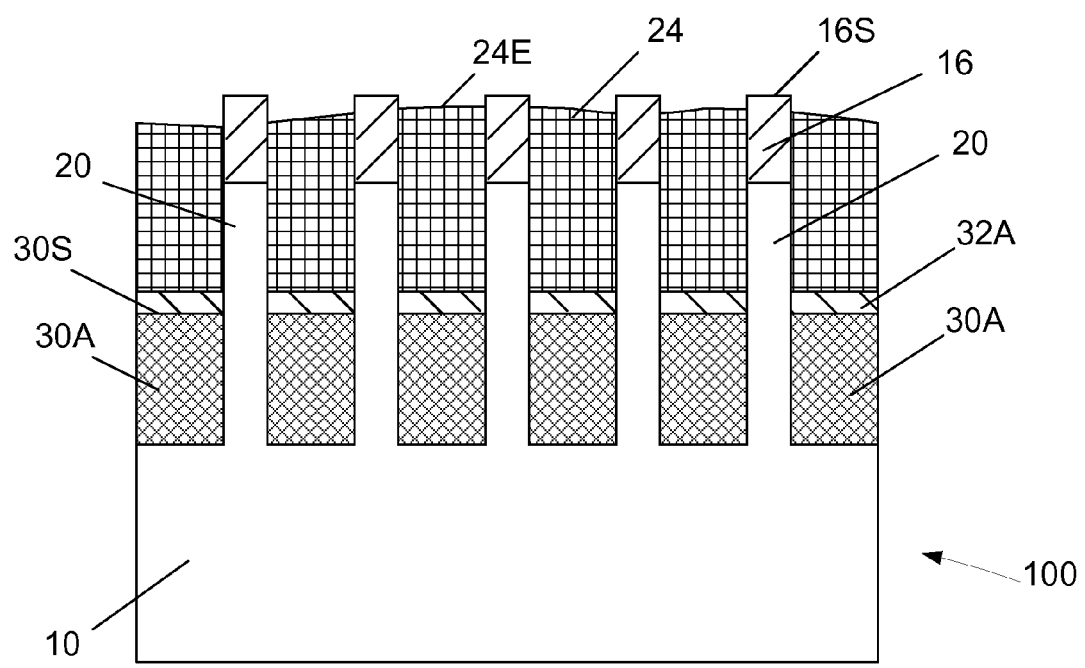

FIG. 2D depicts the device 100 after a chemical mechanical polishing (CMP) process has been performed with the intent to expose the upper surface 16S of the patterned hard mask layer 16. As depicted, the layer of the second material 24 may have a non-uniform polished surface 24P that may not expose all of the upper surfaces 16S of the patterned hard mask layer 16. In some cases, the CMP process may be performed for such a duration to ensure that all of the upper surfaces 16S of the patterned hard mask layer 16 are exposed. Alternatively, as shown in FIG. 2E, a relatively quick etching process may be performed on the layer of the second material 24 after the CMP process is performed to insure that the etched surface 24E of the layer of the second material 24 is at a level such that all of the upper surfaces 16S of the patterned hard mask layer 16 are exposed.

Figure 2F:
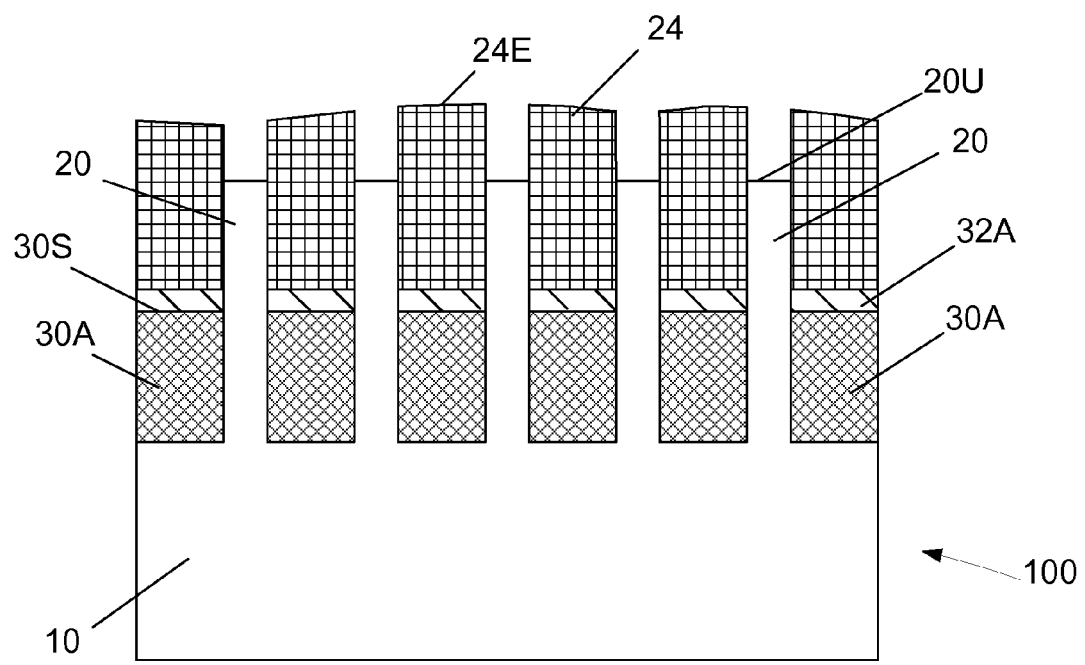

Next, as shown in FIG. 2F, an etching process is performed to remove the exposed patterned hard mask layer 16 from above the fins 20. This process exposes the upper surface 20U of the fins 20. In the case where the second material 24 is comprised of silicon dioxide and the patterned hard mask layer 16 is comprised of silicon nitride, the patterned hard mask layer 16 may be removed by performing an etching process using hot phosphoric acid. Of course, there are other alternative process flows to accomplish removal of the second material 24, the region 32B, the region 30B and the hard mask layer 16. For example, depending upon the materials of construction selected for the regions and layers, a CMP process could be performed to expose the regions 32B, and then the region 32B could be removed by performing an etching process. Thereafter, the regions 30B and the hard mask layer 16 may be removed concurrently or sequentially (depending upon the materials of construction) with the constraint being that the regions 32A are not damged in any such processing.

Figure 2G:
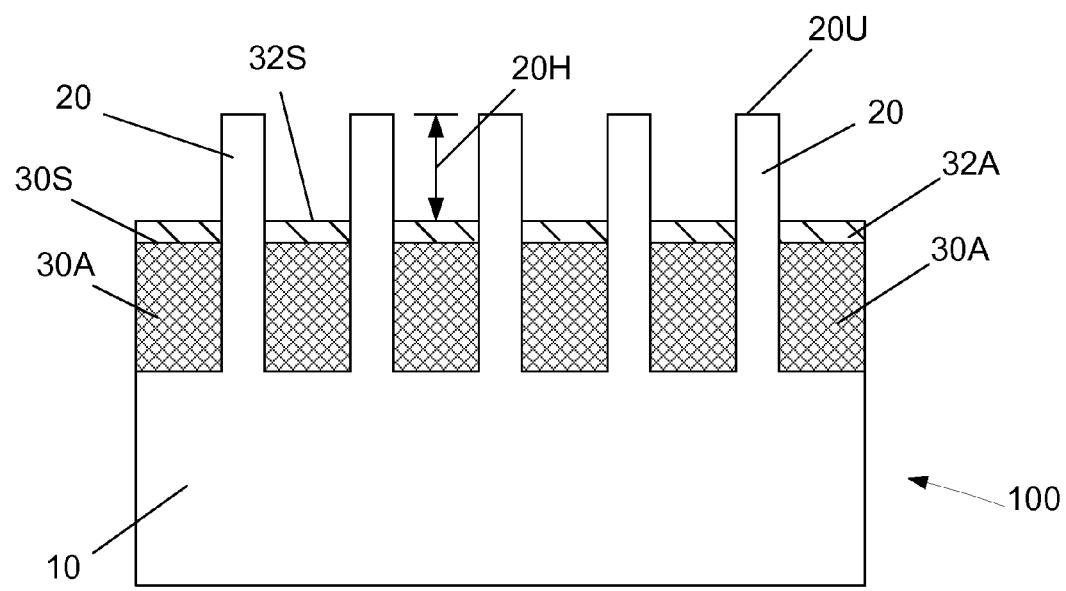
Figure 2H:
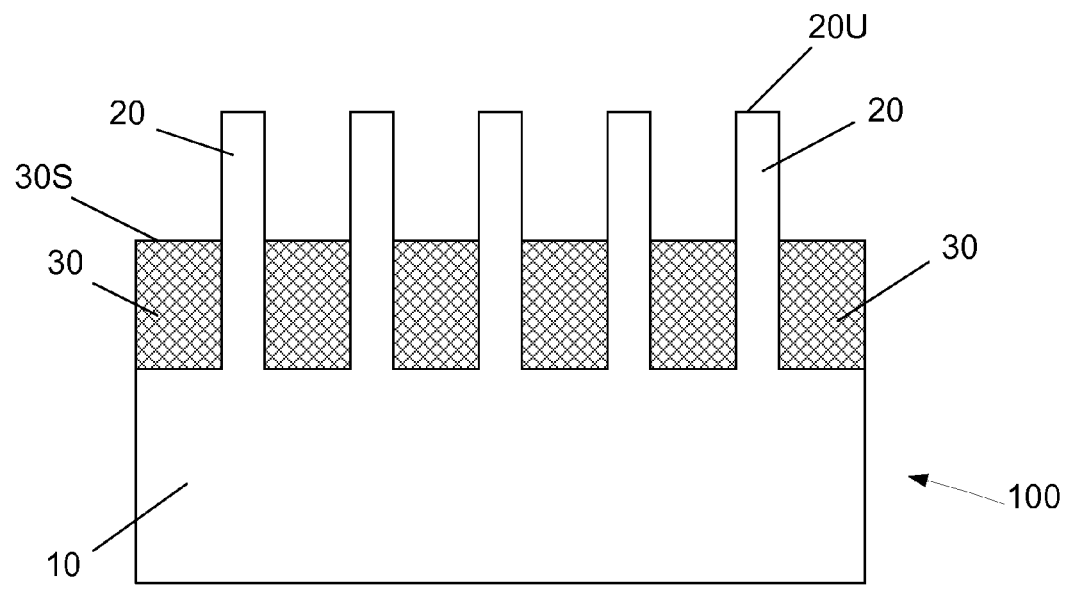

Then, as shown in FIG. 2G, in the illustrative example depicted in the drawings, an etching process or other removal process, such as an ashing process, is performed to remove the layer of the second material 24 selectively relative to the regions 32A of second insulating material 32 and the fins 20. This process exposes the as-deposited surface 32S of the first regions 32A of the second insulating material 32. In the case where the second material 24 is comprised of silicon dioxide and the insulating material 32 is comprised of silicon nitride, the layer of the second material 24 may be removed by performing an etching process using HF acid. As depicted in FIG. 2G, the final fin height 20H is only based upon the initial depth of the trenches 14 and the combined thicknesses of the regions of insulating material 30A, 32A that is deposited in the trenches 14. That is, unlike prior art processes that may produce undesirable variations, the final height 20H of the fins 20 is not based upon the accuracy or planarity of a CMP process, nor is it based upon accurately and repeatedly performing an etching process to reduce the thickness of a layer of material, e.g., silicon dioxide, that is formed in the trenches 14. At this point, traditional fabrication techniques may be performed to complete the fabrication of the illustrative Fin-FET device 100. As another alternative, if desired, the layer of insulating material 32A may be removed from the trenches 14 by performing a selective etching process which would thereby expose the as-deposited surface 30S of the first regions 30A. The resulting structure is depicted in FIG. 2H.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-fied and all such variations are considered within the scope and spirit of the invention. Accordingly, the protection sought herein is as set forth in the claims below.

What is claimed:

1. A method of forming a FinFET device, comprising:
    forming a plurality of spaced-apart trenches in a semiconducting substrate, said trenches defining a fin structure for said device, said fin structure having an upper surface;
    forming a first region of a first insulating material within each of said trenches, said first region of said first insulating material having an as-deposited surface that is positioned below said upper surface of said fin;
    forming a layer of a second material that contacts said as-deposited surface of said first region of said first insulating material and overfills said trenches, wherein at least a portion of said layer of said second material is positioned above said upper surface of said fin structure;
    performing at least one first process operation to remove at least a portion of said layer of said second material from above said upper surface of said fin structure; and
    after performing said at least one first process operation, performing at least one second process operation to selectively remove said second material from above said first region of said first insulating material and thereby expose said as-deposited surface of said first region of said first insulating material.

2. The method of claim 1, wherein forming said first region of said first insulating material comprises performing a directional deposition process to form said first region of said first insulating material.

3. The method of claim 2, wherein said directional deposition process is a gas cluster ion beam process.

4. The method of claim 1, wherein said first insulating material is comprised of silicon nitride and said second material is comprised of silicon dioxide, a photoresist material or an organic development material.

5. The method of claim 1, wherein said first insulating material is comprised of silicon dioxide and said second material is comprised a photoresist material or an organic development material.

6. The method of claim 1, wherein performing said at least one first process operation comprises performing at least one of a chemical mechanical polishing process and an etching process.

7. The method of claim 1, wherein performing said at least one second process operation comprises performing at least one of an etching process or an ashing process.

8. A method of forming a FinFET device, comprising:
forming a plurality of spaced-apart trenches in a semiconducting substrate, said trenches defining a fin structure for said device, said fin structure having an upper surface;
performing a directional deposition process to form a first region of a first insulating material within each of said trenches and to form a second region of said first insulating material above said upper surface of said fin structure, said first region of said first insulating material having an as-deposited surface;
forming a layer of a second material that overfills said trenches and covers an upper surface of said second region of said first insulating material;
removing at least a portion of said layer of said second material to thereby expose said upper surface of said second region of said first insulating material;
performing at least one etching process to remove at least said second region of said first insulating material from above said upper surface of said fin structure; and
performing at least one process operation to selectively remove said second material from above said first region of said first insulating material and thereby expose said as-deposited surface of said first region of said first insulating material.

9. The method of claim 8, wherein said directional deposition process is a gas cluster ion beam process.

10. The method of claim 8, wherein said first insulating material is comprised of silicon nitride and said second material is comprised of silicon dioxide, a photoresist material or an organic development material.

11. The method of claim 8, wherein said first insulating material is comprised of silicon dioxide and said second material is comprised a photoresist material or an organic development material.

12. The method of claim 8, wherein, prior to performing said directional deposition process, performing a conformable deposition process to form a protection layer on sidewalls of said fin and a bottom surface of said trenches.

13. The method of claim 12, wherein said first insulating material is comprised of silicon nitride and said protection layer is comprised of silicon dioxide.

14. The method of claim 8, wherein forming said plurality of trenches in said substrate comprises:
forming a patterned hard mask layer above said substrate; and
performing at least one etching process on said substrate through said patterned hard mask layer to define said trenches in said substrate.

15. The method of claim 8, wherein removing said layer of said second material to thereby expose said upper surface of said second region of said first insulating material comprises:
performing a chemical mechanical polishing process to remove a portion of said layer of said second material; and
after performing said chemical mechanical polishing process, performing an etching process to reduce a thickness of said layer of said second material.

16. The method of claim 8, wherein removing said layer of said second material to thereby expose said upper surface of said second region of said first insulating material comprises performing an etching process on an as-deposited surface of said layer of said second material.

17. The method of claim 8 wherein removing said at least a portion of said layer of said second material comprises performing at least one of an etching process or an ashing process.

18. The method of claim 8, wherein performing said at least one process operation comprises performing at least one of an etching process or an ashing process.

19. A method of forming a FinFET device, comprising:
forming a patterned hard mask layer above a semiconducting substrate;
performing at least one etching process on said substrate through said patterned hard mask layer to define a plurality of spaced-apart trenches in said semiconducting substrate, said trenches defining a fin structure for said device;
performing a directional deposition process to form a first region of a first insulating material within each of said trenches and to form a second region of said first insulating material above a portion of said patterned hard mask layer, said first region of said first insulating material having an as-deposited surface and said second region of said first insulating material having an as-deposited surface;
forming a layer of a second material that overfills said trenches and is positioned above said as-deposited surface of said second region of said first insulating material and contacts said as-deposited surface of said first region of said first insulating material;
removing at least a portion of said layer of said second material to thereby expose said as-deposited surface of said second region of said first insulating material;
performing at least one first etching process to remove at least said second region of said first insulating material and said portion of said patterned hard mask layer positioned below said second region of said first insulating material, wherein said at least one etching process exposes an upper surface of said fin structure; and
performing at least one process operation to selectively remove said second material from above said first region of said first insulating material and thereby expose said as-deposited surface of said first region of said first insulating material.

20. The method of claim 19, wherein said directional deposition process is a gas cluster ion beam process.

21. The method of claim 19, wherein said first insulating material is comprised of silicon nitride and said second insulating material is comprised of silicon dioxide, a photoresist material or an organic development material.

22. The method of claim 19, wherein said first insulating material is comprised of silicon dioxide and said second material is comprised a photoresist material or an organic development material.

23. The method of claim 19, wherein, prior to performing said directional deposition process, performing a conformable deposition process to form a protection layer on sidewalls of said fin and a bottom surface of said trenches.

24. The method of claim 23, wherein said first insulating material is comprised of silicon nitride and said protection layer is comprised of silicon dioxide.

25. The method of claim 19, wherein removing said layer of said second material to thereby expose said as-deposited surface of said second region of said first insulating material comprises:
performing a chemical mechanical polishing process to remove a portion of said layer of said second material; and
after performing said chemical mechanical polishing process, performing an etching process to reduce a thickness of said layer of said second material.

26. The method of claim 19, wherein removing said layer of said second material to thereby expose said as-deposited surface of said second region of said first insulating material comprises performing an etching process on an as-deposited surface of said layer of said second material.

27. The method of claim 19, wherein removing said at least a portion of said layer of said second material comprises performing at least one of an etching process or an ashing process.

28. The method of claim 19, wherein performing said at least one process operation comprises performing at least one of an etching process or an ashing process.

29. A method of forming a FinFET device, comprising:
forming a plurality of spaced-apart trenches in a semiconducting substrate, said trenches defining a fin structure for said device, said fin structure having an upper surface;
forming a first region of a first insulating material within each of said trenches, said first region of said first insulating material having an as-deposited surface that is positioned below said upper surface of said fin;
forming a first region of a second insulating material within each of said trenches that contacts said as-deposited surface of said first region of said first insulating material, said first region of said second insulating material having an as-deposited surface that is positioned below said upper surface of said fin
forming another layer of material that contacts said as-deposited surface of said first region of said second insulating material and overfills said trenches, wherein at least a portion of said another layer of material is positioned above said upper surface of said fin structure;
performing at least one first process operation to remove at least a portion of said another layer of material from above said upper surface of said fin structure; and
after performing said at least one first process operation, performing at least one second process operation to selectively remove said another layer of material from above said first region of said second insulating material and thereby expose said as-deposited surface of said first region of said second insulating material.

30. The method of claim 29, further comprising performing another etching process to selectively remove said first region of said second material to thereby expose said as-deposited surface of said first region of said first insulating material.

31. The method of claim 29, wherein said first insulating material is comprised of silicon dioxide, said second insulating material is comprised of silicon nitride and said another layer of material is comprised of silicon dioxide.

32. The method of claim 29, wherein forming said first region of said first insulating material comprises performing a directional deposition process to form said first region of said first insulating material.

33. The method of claim 32, wherein forming said first region of said second insulating material comprises performing a second directional deposition process to form said first region of said second insulating material.

34. The method of claim 29, wherein said another layer of material is comprised of silicon dioxide, a photoresist material or an organic development material.

\* \* \* \* \*